(12) United States Patent
Chen et al.

(10) Patent No.: US 8,772,845 B2
(45) Date of Patent: Jul. 8, 2014

(54) TECHNIQUE FOR SMOOTHING AN INTERFACE BETWEEN LAYERS OF A SEMICONDUCTOR DEVICE

(75) Inventors: Chih-Ming Chen, Hsinchu (TW);
Cheng-Yuan Tsai, Chu-Pei (TW);
Chung-Yi Yu, Hsin-Chu (TW);
Kai-Wen Cheng, Hsinchu County (TW);
Kuo-Ming Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 13/240,714

(22) Filed: Sep. 22, 2011

(65) Prior Publication Data
US 2013/0075837 A1    Mar. 28, 2013

(51) Int. Cl.
*H01L 21/02*    (2006.01)

(52) U.S. Cl.
USPC ............... 257/295; 257/421; 257/E21.665

(58) Field of Classification Search
None
See application file for complete search history.

(56) References Cited

U.S. PATENT DOCUMENTS

| | | | |
|---|---|---|---|
| 2006/0068196 A1* | 3/2006 | Suenaga et al. | 428/328 |
| 2008/0061388 A1* | 3/2008 | Diao et al. | 257/421 |
| 2008/0135957 A1 | 6/2008 | Liaw et al. | |
| 2010/0258886 A1* | 10/2010 | Wang et al. | 257/421 |
| 2011/0318848 A1* | 12/2011 | Choi et al. | 438/3 |

* cited by examiner

*Primary Examiner* — Whitney T Moore
*Assistant Examiner* — Joseph Galvin, III
(74) *Attorney, Agent, or Firm* — Haynes and Boone, LLP

(57) ABSTRACT

The present disclosure provides a semiconductor memory device. The device includes a pinning layer having an anti-ferromagnetic material and disposed over a first electrode; a pinned layer disposed over the pinning layer; a composite layer disposed over the pinned layer, the composite layer having a magnetic material randomly distributed in a non-magnetic material; a barrier layer disposed on the composite layer; a free layer disposed over the barrier layer; and a second electrode disposed over the free layer.

25 Claims, 9 Drawing Sheets

TECHNIQUE FOR SMOOTHING AN INTERFACE BETWEEN LAYERS OF A SEMICONDUCTOR DEVICE

BACKGROUND

In integrated circuit (IC) devices, magnetic random access memory (MRAM) is an emerging technology for next generation embedded memory devices. MRAM is a memory device including an array of MRAM cells each of which stores a bit of data using resistance values, rather than electronic charge. Each MRAM cell includes a magnetic tunnel junction (MTJ) cell, the resistance of which can be adjusted to represent logic "0" or logic "1." Conventionally, the MTJ cell includes an anti-ferromagnetic (AFM) pinning layer, a ferromagnetic fixed, or pinned, layer, a thin tunneling barrier layer, and a ferromagnetic free layer. The resistance of the MTJ cell may be adjusted by changing the direction of the magnetic moment of the ferromagnetic free layer with respect to that of the fixed magnetic layer. In particular, when the magnetic moment of the ferromagnetic free layer is parallel to that of the ferromagnetic fixed layer, the resistance of the MTJ cell is low, corresponding to a logic 0, whereas when the magnetic moment of the ferromagnetic free layer is anti-parallel to that of the ferromagnetic fixed layer, the resistance of the MTJ cell is high, corresponding to a logic 1. The MTJ cell is coupled between top and bottom electrodes and an electric current flowing through the MTJ cell from one electrode to the other may be detected to determine the resistance, and therefore the logic state, thereof.

MRAM based on spin transfer torque (STT) switching has been intensively developed as a promising non-volatile RAM. However, because an MTJ cell is composed of one or several thin (i.e., <20 Å) films, reducing interface roughness and enhancing crystal anisotropy are important factors in improving magnetoresistance percentage (MR %) and thermal stability of the MTJ cell. Currently, one technique for smoothing the interface of the MTJ is to adjust the parameters of the MTJ deposition; however, this technique does not result in sufficient smoothness. Moreover, the technique causes degradation of magnetic properties of the MTJ cell, such as MR %, as well as switching field (Hc) and resistive area (RA).

Accordingly, it would be desirable to provide an improved STT-MRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
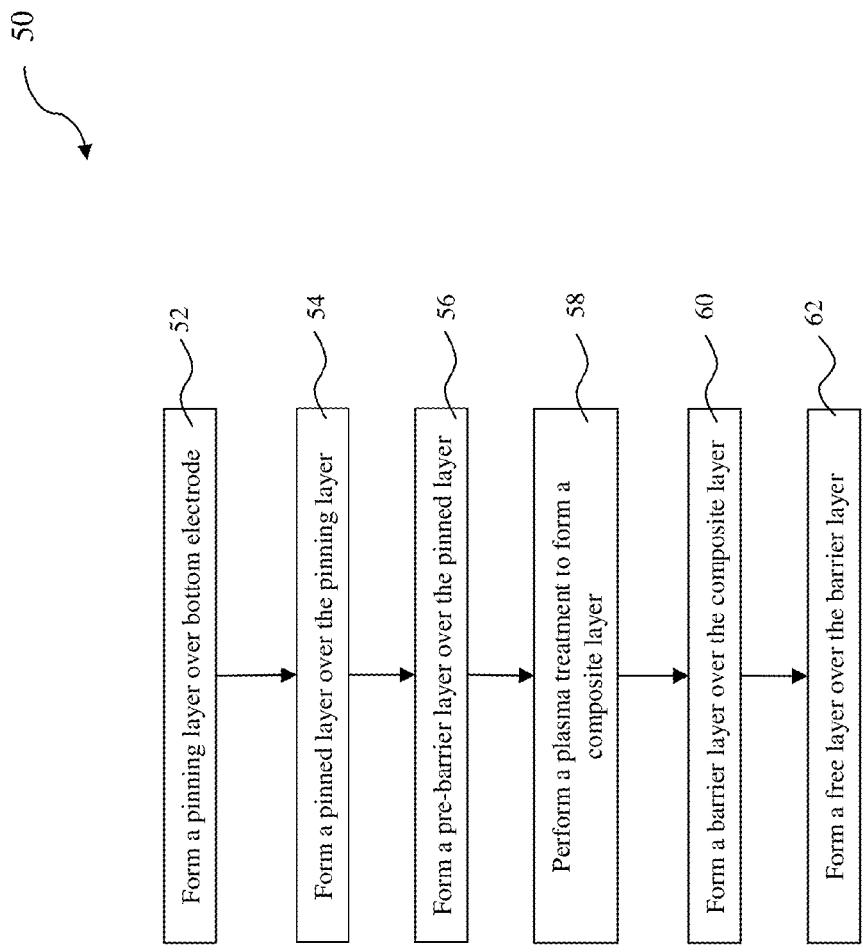
FIG. 1 is a flowchart of a method making of a semiconductor memory device constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of a method 50 making of a semiconductor memory device constructed according to aspects of the present disclosure in one embodiment. FIGS. 2 through 5 are sectional views illustrating an embodiment of a semiconductor memory device 100 at various fabrication stages constructed according to aspects of the present disclosure. With references to FIGS. 1 through 5, the semiconductor memory device 100 and the method 50 making the same are collectively described.

The device 100 is a portion of one spin torque transfer magnetic random access memory (STT-MRAM). In one embodiment, the semiconductor memory device 100 includes a stack of material layers designed and configured to function as a magnetic tunnel junction (MTJ).

The semiconductor memory device 100 is formed on a semiconductor substrate, such as silicon substrate or alternatively other suitable semiconductor substrate. The semiconductor memory device 100 includes a first electrode (or bottom electrode) 102 of conductive material. In one embodiment, the first electrode 102 includes tantalum (Ta). In other embodiments, the first electrode may include other appropriate materials for forming such an electrode, such as platinum (Pt) or ruthenium (Ru). The first electrode 102 can be formed by a physical vapor deposition (PVD or sputtering) or alternatively other suitable processes. In another embodiment, the first electrode 102 has a thickness ranging between about 100 angstrom and about 300 angstrom.

Figure 2:
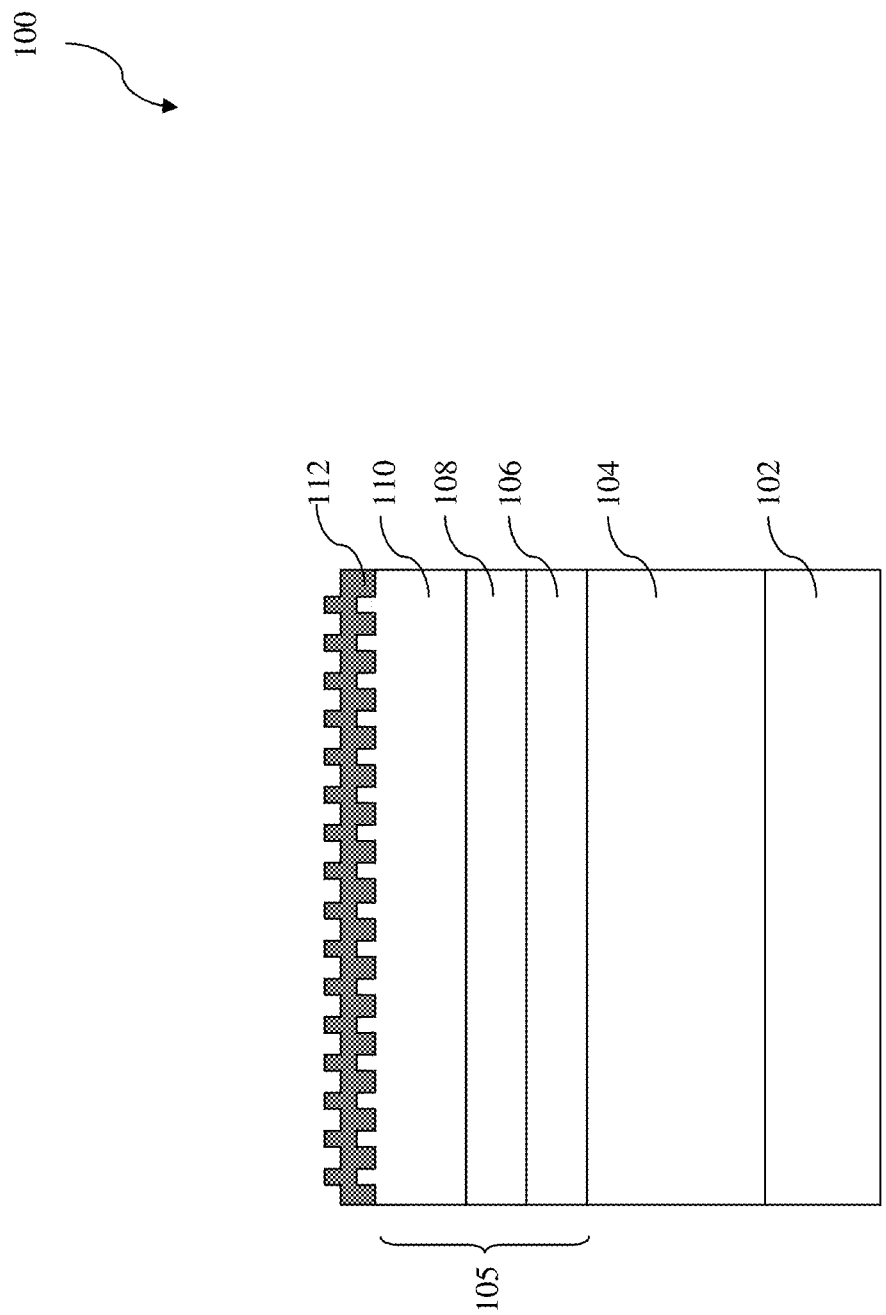
FIGS. 2 through 5 are sectional views illustrating an embodiment of a semiconductor memory device at various fabrication stages constructed according to aspects of the present disclosure.

Referring to FIGS. 1 and 2, the method 50 begins at step 52 by forming a pinning layer 104 over the first electrode 102. In one embodiment, the pining layer 104 includes an anti-ferromagnetic (AFM) material. In the anti-ferromagnetic material, the magnetic moments of atoms or molecules align in a regular pattern with neighboring spins pointing in opposite directions. In one example, the anti-ferromagnetic layer 104 includes platinum manganese (PtMn). In another example, the anti-ferromagnetic layer 104 includes iridium manganese (IrMn), rhodium manganese (RhMn), and iron manganese (FeMn). In another example, the anti-ferromagnetic layer has a thickness ranging between about 100 angstrom and about 200 angstrom. The pinning layer 104 is formed by a suitable deposition technique, such as PVD.

Still referring to FIGS. 1 and 2, the method 50 proceeds to step 54 by forming a pinned layer 105 over the pinning layer 104. In one embodiment, the pinned layer 105 includes a ferromagnetic material layer. The ferromagnetic material can form permanent magnets and/or exhibit strong interactions with magnets. In one embodiment, the ferromagnetic layer 105 includes a cobalt-iron-boron (CoFeB) film. The ferromagnetic material layer may alternatively include other materials, such as CoFeTa, NiFe, Co, CoFe, CoPt, CoPd, FePt, or the alloy of Ni, Co and Fe. As one example, the CoFeB film is formed by PVD, or alternatively other suitable process.

The pinned layer 105 may alternatively include a multi-layer structure. In one embodiment, the pinned layer 105 includes a first pinned layer (or bottom pinned layer) 106 and a second pinned layer (or top pinned layer) 110 interposed by a spacer layer 108. In this embodiment, the first pinned layer 106 is disposed on the pining layer 104. In furtherance of the embodiment, the first pinned layer 106 includes a ferromagnetic material. In one example, the ferromagnetic material in the first pinned layer 106 includes a CoFeB film. The ferromagnetic material layer may alternatively include other materials, such as CoFeTa, NiFe, Co, CoFe, CoPt, CoPd, FePt, or the alloy of Ni, Co and Fe. The first pinned layer 106 may have a thickness ranging between about 15 angstrom and about 35 angstrom.

The spacer layer 108 is disposed on the first pinned layer 106. In one embodiment, the spacer layer 108 includes ruthenium (Ru). Alternatively, the spacer layer 108 may include other suitable material, such as Ti, Ta, Cu, or Ag. In one example, the spacer layer 108 has a thickness ranging between about 5 angstrom and about 10 angstrom. The spacer layer may be formed by a PVD process, or another suitable process.

The second pinned layer 110 is disposed on the spacer layer 108. As one embodiment, the second pinned layer 110 includes a ferromagnetic material layer substantially similar to that of the first pinned layer. For example, the second pinned layer 110 includes a cobalt-iron-boron (CoFeB) film. In one example, the second pinned layer 110 has a thickness ranging between about 15 angstrom and about 35 angstrom. The second pinned layer may be formed by PVD, or other alternative processing method.

In another alternatively embodiment, the pinned layer 105 includes multiple films. Particularly, the pinned layer 105 includes a first pinned layer 106 having a first film of a first ferromagnetic material and a second film of a second ferromagnetic material on the first film of the first ferromagnetic material. The pinned layer 105 includes a spacer layer 108 formed on the first pinned layer 106 and a second pinned layer 110 formed on the spacer layer 108. The second pinned layer 110 includes a third film of the first ferromagnetic material and a fourth film of the second ferromagnetic material on the third film of the first ferromagnetic material.

Such a pinned layer 105 forms a synthetic AFM to provide greater exchange bias. In the illustrated embodiment, the pinned layer 105 includes a combination of a CoFeB film (the first film), CoFe (the second film), a Ru layer (the spacer layer), a CoFeB film (the third film), and a CoFe layer (the fourth film) stacked together. In one example, each of the first through the fourth films has a thickness ranging between about 10 angstrom and about 30 angstrom. Each film may have a thickness different from other films for enhanced performance of the pinned layer. However, it will be recognized that the pinned layer 105 may be implemented using other types of materials and combinations of materials appropriate for implementing a fixed ferromagnetic layer.

As will be recognized by one of ordinary skill in the art, a purpose of the pinning layer 104 is to fix, or pin, the magnetization direction of the fixed ferromagnetic layer 105 through anti-ferromagnetic coupling.

The pinned layer 105 has a rough surface due to the characteristic of the deposition process, such as PVD, as schematically illustrated in FIG. 2. So the surface of the pinned layer 105 is not even and smooth.

Still referring to FIGS. 1 and 2, the method 50 proceeds to step 56 by forming a pre-barrier layer 112 on the surface of the pinned layer 105. In one embodiment, the pre-barrier layer 112 includes a non-magnetic material, such as magnesium (Mg), formed on the pinned layer 105 and having an appropriate thickness, such as a thickness ranging between about 4 angstrom and about 10 angstrom. In the present embodiment, the pre-barrier layer 112 is deposited on the pinned layer 105 by PVD. As illustrated in FIG. 2, a top surface of the pre-barrier layer 112 is uneven.

The pre-barrier layer 112 may include other proper material, such as aluminum oxide (AlO) or magnesium oxide (MgO). The pre-barrier layer 112 may include other structure, such as two or more films. In an alternative embodiment, the pre-barrier layer 112 includes a MgO film on the pinned layer 105 and a Mg film on the MgO film. In furtherance of the embodiment, a first Mg film is formed on the pinned layer 105, then an oxidation process is applied to the first Mg film such that the first Mg film is converted into a MgO film. Then a second Mg film is formed on the MgO film. In the present embodiment, various steps, including Mg deposition and oxidation, of forming the pre-barrier layer 112 are implemented in a PVD tool. In another example of the pre-barrier layer 112, each of the first and second Mg films has a thickness ranging between about 4 angstrom and 10 angstrom. In another example of the pre-barrier layer 112, the first Mg film prior the oxidation is thicker than the second Mg film. Additionally, other metals and/or metal oxides may be substituted for MgO/Mg pre-barrier layer 113, including but not limited to aluminum (Al) and/or aluminum oxide (AlO).

Figure 3:
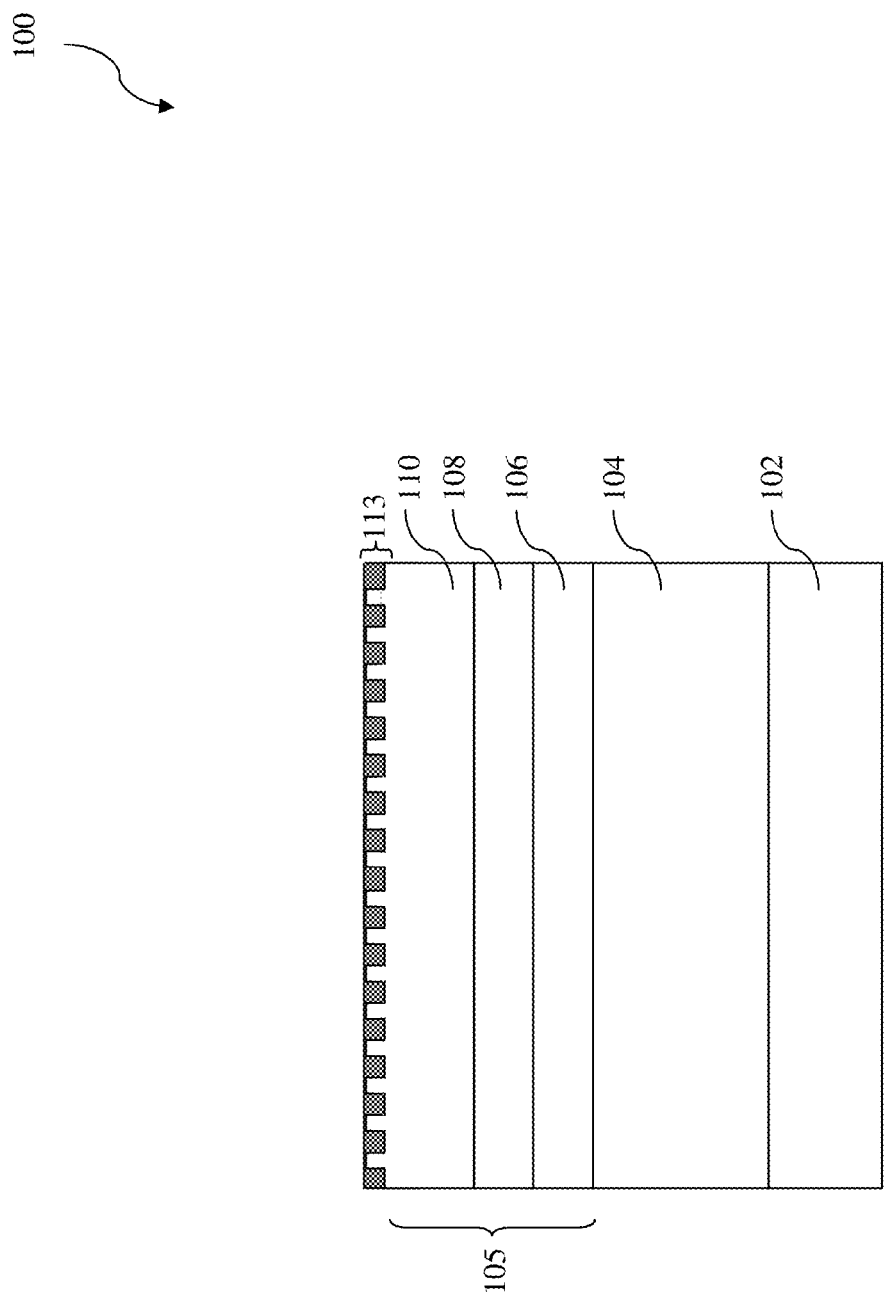

Referring to FIGS. 1 and 3, the method 50 proceeds to step 58 by performing a plasma treatment to the pre-barrier layer 112. In the present embodiment, the plasma treatment is implemented by a PVD tool to achieve a sputtering etch to partially remove the pre-barrier layer 112 and smooth thereof, resulting in a composite layer 113. In a particular embodiment, the plasma treatment is implemented by the same PVD tool to form the pre-barrier layer 112. In furtherance of the embodiment of the plasma treatment, the PVD tool (or PVD chamber) is set up to provide the substrate (or the wafer) a voltage (e.g., a negative voltage) such that the charged ions are impinged to the substrate with proper energy during the plasma treatment. The pre-barrier layer 112 on the substrate is sputtered and is partially removed, resulting in a smooth surface. In the present embodiment, argon (Ar) is used in the plasma treatment. However, in alternative embodiments, the plasma treatment may be performed using an alternative plasma source, including but not limited to nitrogen ($N_2$), ammonia ($NH_3$), helium (He), oxygen ($O_2$), krypton (Kr), and hydrogen ($H_2$).

In the present embodiment, the plasma treatment uses low power and low flow rate tuned to favorably remove the extruded portion of the pre-barrier layer 112 and effectively smooth the rough surface. In furtherance of the embodiment, the plasma treatment is implemented with a gas flow rate ranging between about 50 sccm and about 300 sccm and an alternating current (ac) power ranging between about 20 V and about 200 V. In various embodiments, the plasma treatment is implemented with a direct current (dc) power ranging between about 50 V and about 200 V where the substrate is negatively biased, and/or a plasma treating duration ranging between about 20 second and about 200 second such that a rough portion is substantially removed. In another embodiment, the substrate is set at an environmental temperature, such as room temperature.

Thus formed composite layer 113 has a substantially smooth surface. The composite layer 113 includes both the ferromagnetic material from a top portion of the pinned layer 105 and the non-magnetic material (e.g., Mg) of a bottom portion of the pre-barrier layer 112. In the composite layer 113, the ferromagnetic material is randomly distributed in the non-magnetic material. In one example, the composite layer 113 has a thickness ranging between about 3 angstrom and about 10 angstrom. As illustrated in FIG. 3, the plasma treatment has rendered the surface of the composite layer 113 smooth and uniform.

Although the plasma treatment described herein is shown and described as being performed on the Mg film, it will be recognized that the plasma treatment may be applied to one or more of the other layers, including but not limited to the pinned layer, such as the CoFe and CoFeB films, as well to improve interface conditions in connection with those films and thereby enhance the overall performance of the MTJ cell. In one embodiment, the plasma treatment is alternatively applied to the pinned layer 105 to smooth the pinned layer accordingly. In this case, the pre-barrier layer is eliminated. In another embodiment, another plasma treatment is applied to the pinned layer 105 prior to the deposition of the pre-barrier layer 112 to reduce the roughness of the pinned layer 110.

Figure 4:
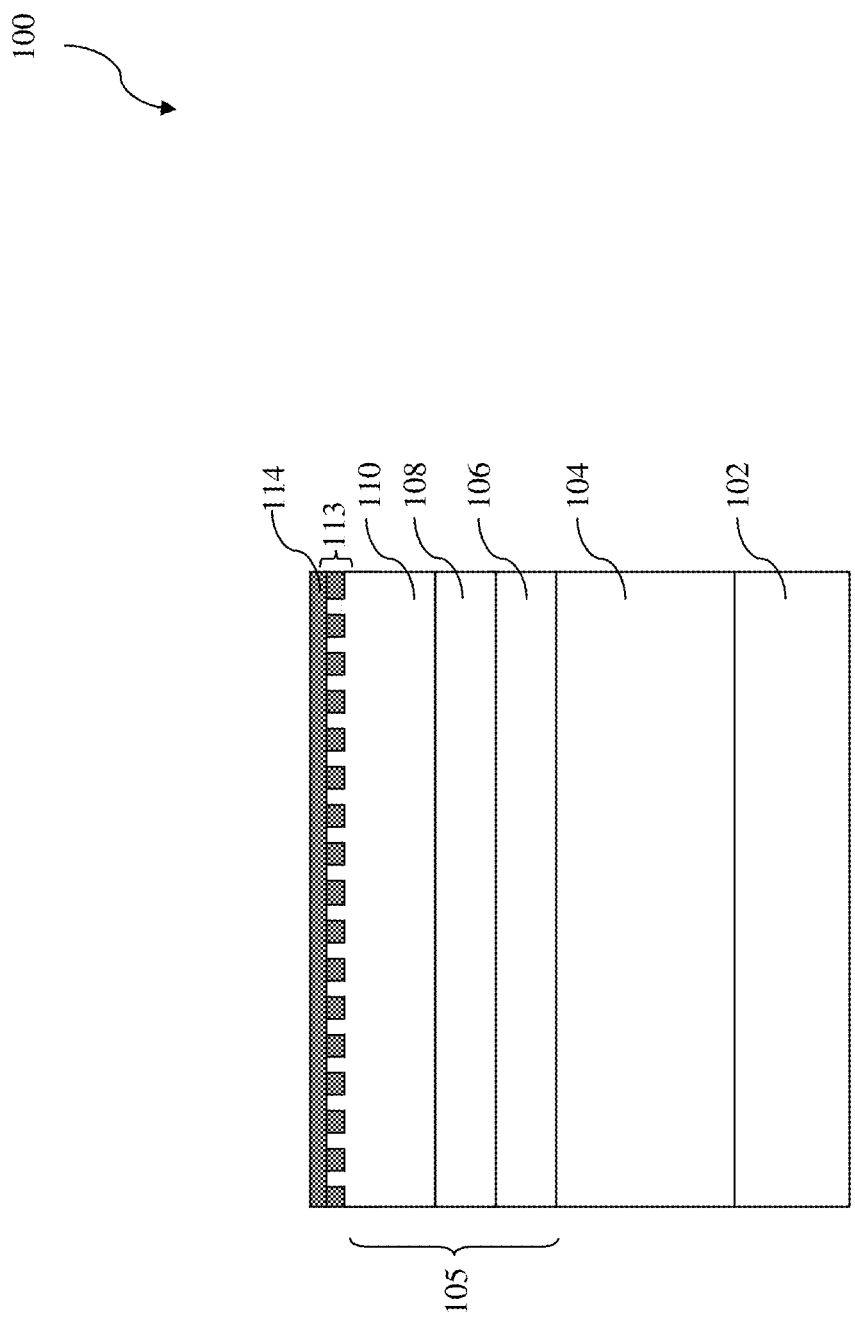

Referring to FIGS. 1 and 4, the method 50 proceeds to step 60 by forming a barrier layer 114 on the composite layer 113. Since the composite layer 113 has a smooth surface, the barrier layer 114 has a substantially smooth surface as well, accordingly. The barrier layer 114 includes Mg. Alternatively, the barrier layer 114 may include MgO, AlO, aluminum nitride (AlN), aluminum oxynitride (AlON), or other suitable non-magnetic material. In another embodiment, the barrier layer 114 includes a first film of MgO and a second film of Mg over the first film, which may be formed by Mg deposition, Mg oxidation and Mg deposition. The barrier layer 114 is thin enough such that electrons can tunnel through the barrier layer when a biasing voltage is applied on. In one embodiment, the barrier layer 114 has a thickness ranging between about 5 angstrom and about 15 angstrom. The barrier layer 114 may be formed by PVD. For example, a magnesium target is used with an oxygen gas provided in a sputtering chamber to form magnesium oxide. Alternatively, a magnesium film is formed first by sputtering and then converting it into the MgO film by applying an oxygen plasma. In another embodiment of the barrier layer, a first magnesium film is formed by sputtering and then converting it into the MgO film by applying an oxygen gas, and then a second Mg layer is deposited on the MgO layer by sputtering. In one embodiment, the deposition of the barrier layer 114 is implemented in the same PVD tool used for forming the pre-barrier layer 112 and performing the plasma treatment. Thus, the fabrication time is reduced and the cross-contamination is reduced as well.

Figure 5:
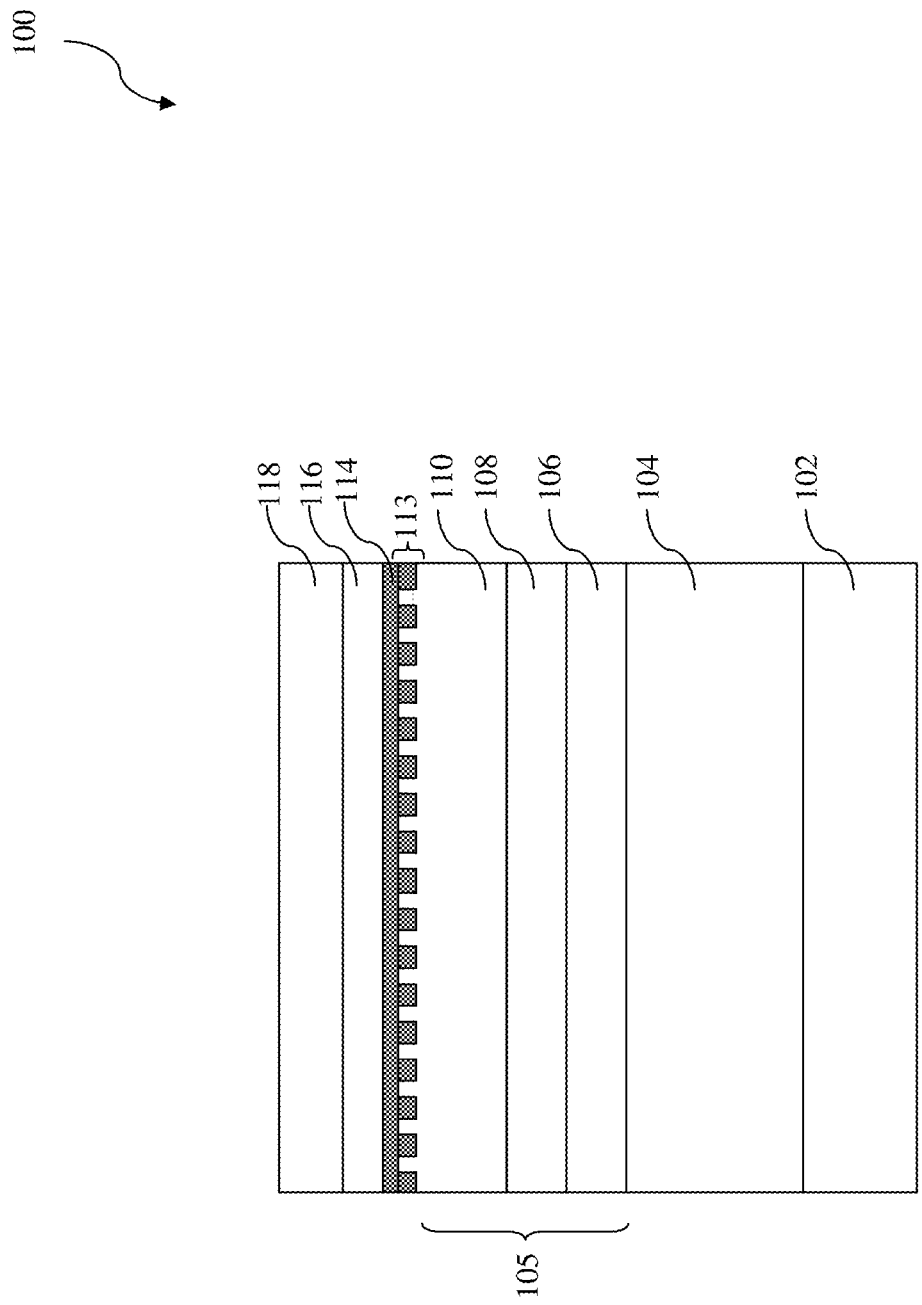

Referring to FIGS. 1 and 5, the method 50 proceeds to step 62 by forming a free layer 116 on the barrier layer 114. The free layer 116 may also include a ferromagnetic material but it is not pinned because there is no anti-ferromagnetic material adjacent the free layer. Therefore, the magnetic orientation of the layer is free, thus referred to as a free layer. The free layer 116 may include a ferromagnetic material similar to the ferromagnetic material used in the pinned layer 105. As will be recognized by one of ordinary skill in the art, the magnetization direction of the ferromagnetic free layer 116 is free to rotate parallel or anti-parallel to the pinned magnetization of the pinned ferromagnetic layer 105. A tunneling current flows perpendicularly through the tunneling barrier layer 114 depending upon the relative magnetization directions of the two ferromagnetic layers 105, 116.

In one embodiment, the free layer 116 includes a CoFeB film. In one example, the CoFeB may have compositions expressed in $(Co_xFe_{1-x})_{80}B_{20}$, wherein the x is an alloy mole fraction and ranges between 0 and 100. the subscripts "80" and "20" are also mole fractions. In another example, the CoFeB may have compositions expressed in $Co_{20}Fe_{60}B_{20}$. The free layer 116 may have a thickness ranging between about 10 angstrom and about 20 angstrom. The free layer 116 may be formed by a process, such as PVD. Particularly, the free layer 116 may be formed by the same PVD tool used to form other underlying layers, such as the composite layer 113 and/or the barrier layer 114.

The free layer may include two or more ferromagnetic films of different materials and may be further interposed by a spacer layer between neighbor ferromagnetic films. In one alternative embodiment, the free layer 116 includes a first ferromagnetic film disposed on the barrier layer 114 and a second ferromagnetic film disposed over the first ferromagnetic film. Particularly, the first ferromagnetic film includes a hard ferromagnetic material having a first coercivity. In one example, the first ferromagnetic film includes a CoFeB film. The hard ferromagnetic material layer may have a thickness ranging between about 10 angstrom and about 20 angstrom. The first ferromagnetic film may be formed by a process, such as PVD. The second ferromagnetic film includes a soft ferromagnetic material having a second coercivity less than the first coercivity of the first ferromagnetic film. In one example, the second ferromagnetic film includes a nickel iron (NiFe) film. The soft ferromagnetic material layer may have a thickness less than the thickness of the first ferromagnetic film. The second ferromagnetic film may be formed by a process, such as PVD. A spacer layer may be additionally formed between the first and second ferromagnetic films. The spacer layer may include Ta, Ru, copper (Cu), other suitable material or combinations thereof.

Other steps may be implemented before, during and/or after the method 50. In another example, the material stack formed above is further patterned to form one or more MTJs. In another embodiment, various material layers of the MTJs are deposited by sputtering and are further implemented in a same PVD tool for reduced cost. In another embodiment, the plasma treatment is additionally or alternatively applied to other material layer, such as the pinned layer, the spacer layer, or other thin material layer. In another embodiment, the deposition to form a thin material and the plasma treatment to the corresponding thin material layer are implemented in the same PVD tool, where the plasma treatment includes a sputtering etch to partially remove and smooth the thin material layer.

In another embodiment, a second electrode (or top electrode) 118 is formed on the free layer 116. In one embodiment, the second electrode 118 directly contacts the free layer 116, therefore there is no additional material layer between the second electrode 118 and the free layer 116. In one example, the top electrode 118 directly contacts the second ferromagnetic film of the free layer 116. In another embodiment, the second electrode 118 includes tantalum. Alternatively, the second electrode includes other suitable conductive material to electrically connect the device to other portion of the interconnect structure for pre-designed electrical routing. The second electrode layer may be formed by a PVD process in one embodiment.

As a result of performing plasma treatment, tunneling magnetoresistance (TMR) is improved without degrading RA, wherein R is low magnetoresistance and A is the area of the barrier layer 114. Moreover, such plasma treatment not only improves micro-uniformity of the composite layer 113, it also dramatically improves within wafer (WiW) uniformity. Accordingly, when the barrier layer 114 is smoothed, MR % is increased. The threshold magnetic field Hc is increased. The crystal anisotropy Kn and the thermal stability Eb are increased as well. MR % is defined as a relative difference between the high magnetoresistance R_high and low magnetoresistance R_low as (R_high−R_low)/R_low.

Figure 6:
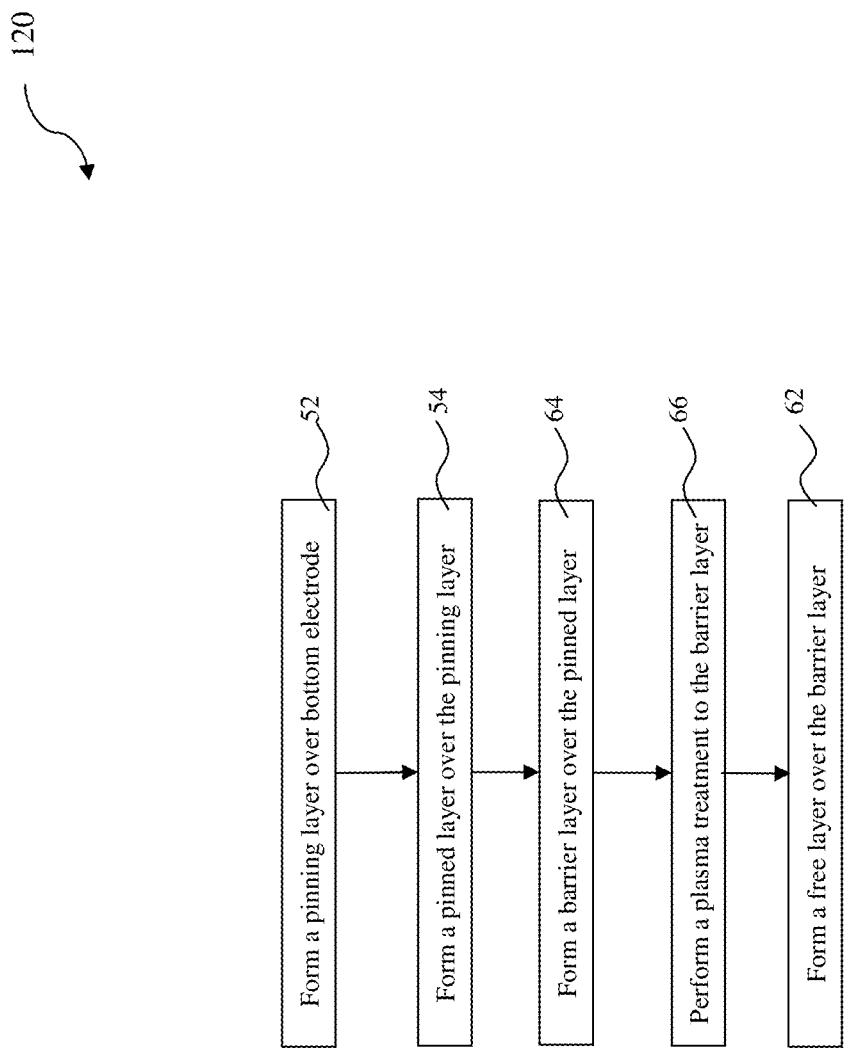
FIG. 6 is a flowchart of a method making of a semiconductor memory device constructed according to aspects of the present disclosure in another embodiment.

An alternative embodiment of a method 120 is provided below with reference to FIG. 6 as a flowchart. In this alternative embodiment, the method 120 includes steps 52, 54 and 62 similar to the corresponding steps in FIG. 1. The method 120 further includes steps 64 and 66 described below. Various material layers are referred to by respective numerals used in FIGS. 2 through 5. At step 64, a barrier layer 114 is directly formed on the pinned layer 105. The barrier layer deposited at step 64 is similar to the barrier layer deposited at step 60 of FIG. 1 in terms of composition and deposition. For example, the barrier layer 114 includes Mg, MgO, AlO, or other suitable non-magnetic material. In another example, the barrier layer is deposited by sputtering in a PVD tool. However, the barrier layer deposited at step 64 is thicker than the barrier layer deposited at step 60 of FIG. 1 such that the final thickness of the barrier layer after the next step 66 is substantially same to the thickness of the barrier layer deposited at step 60.

Thereafter, a plasma treatment is applied to the barrier layer at step 66. The plasma treatment at step 66 is similar to the plasma treatment at 58 of FIG. 1 but is applied to the barrier layer 114. The plasma treatment partially removes (or etches back) the barrier layer deposited at step 64 and reduces the thickness thereof. The corresponding surface of the barrier layer is smoothed and the surface roughness is reduced. Particularly, the plasma treatment is implemented by a PVD tool to achieve a sputtering etch to the barrier layer 114. In the depicted embodiment, the plasma treatment is implemented by the same PVD tool to form the barrier layer 114. In furtherance of the embodiment of the plasma treatment, the PVD tool is set up to provide the substrate (or the wafer) a negative voltage such that the charged ions are impinged to the substrate with proper energy during the plasma treatment. The barrier layer 114 on the substrate is sputtered and is partially removed, resulting in a smooth surface. In various embodiments, the plasma source includes Ar, $N_2$, $NH_3$, He, $O_2$, Kr, or $H_2$. The subsequent steps are implemented thereafter. For example, the step 62 is implemented to form the free layer 116 on the barrier layer 114.

Figure 7:
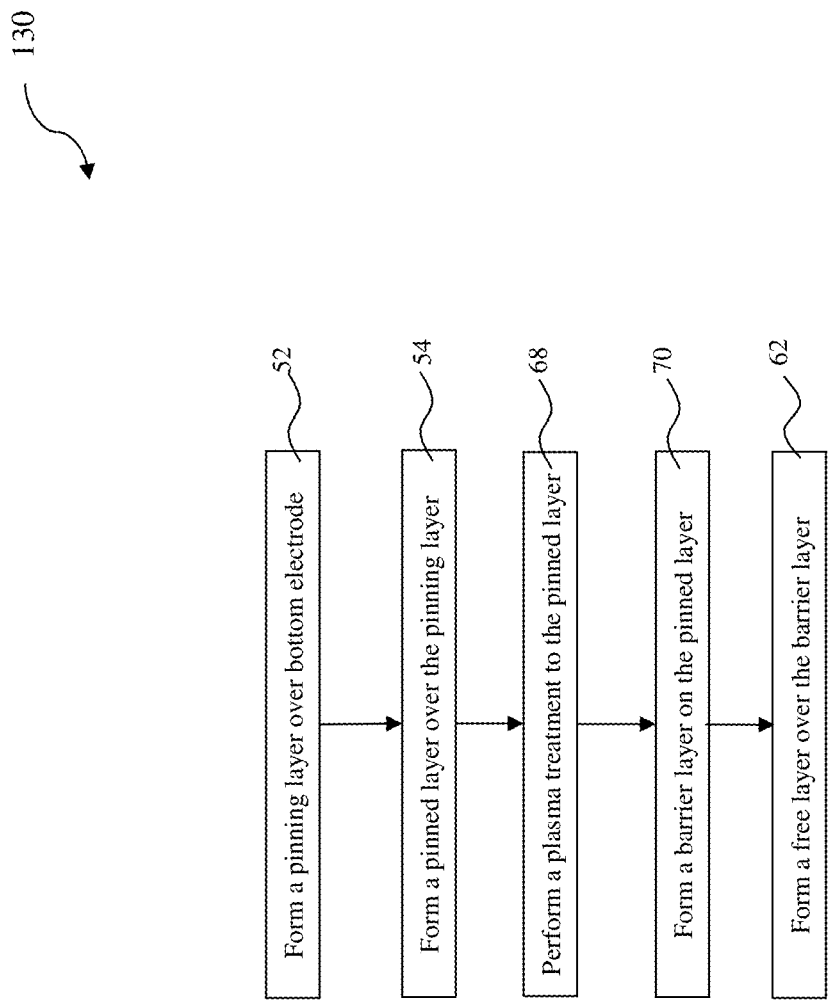
FIG. 7 is a flowchart of a method making of a semiconductor memory device constructed according to aspects of the present disclosure in another embodiment.

Another alternative embodiment of a method 130 is provided below with reference to FIG. 7 as a flowchart. In this alternative embodiment, the method 130 includes steps 52, 54 and 62 similar to the corresponding steps in FIG. 1. The method 130 further includes steps 68 and 70 described below. Various material layers are referred to by respective numerals used in FIGS. 2 through 5. A plasma treatment is applied to the pinned layer at step 68. The plasma treatment at step 68 is similar to the plasma treatment at 58 of FIG. 1 but is applied to the pinned layer 105. The plasma treatment partially removes (or etches back) the pinned layer deposited at step 54 and reduces the thickness thereof. The corresponding surface of the pinned layer is smoothed and the surface roughness is reduced. Particularly, the plasma treatment is implemented by a PVD tool to achieve a sputtering etch to the pinned layer 105. In the depicted embodiment, the plasma treatment is implemented by the same PVD tool to form the pinned layer 105. In furtherance of the embodiment of the plasma treatment, the PVD tool is set up to provide the substrate (or the wafer) a negative voltage such that the charged ions are impinged to the substrate with proper energy during the plasma treatment. The pinned layer 105 on the substrate is sputtered and is partially removed, resulting in a smooth surface. In various embodiments, the plasma source includes Ar, $N_2$, $NH_3$, He, $O_2$, Kr, or $H_2$.

Thereafter, a barrier layer 114 is directly formed on the pinned layer 105 at step 70. The barrier layer deposited at step 70 is similar to the barrier layer deposited at step 60 in terms of composition and deposition. For example, the barrier layer 114 includes Mg, MgO, AlO, or other suitable non-magnetic material. In another example, the barrier layer is deposited by sputtering in a PVD tool. The subsequent steps are implemented thereafter. For example, the step 62 is implemented to form the free layer 116 on the barrier layer 114.

Figure 8:
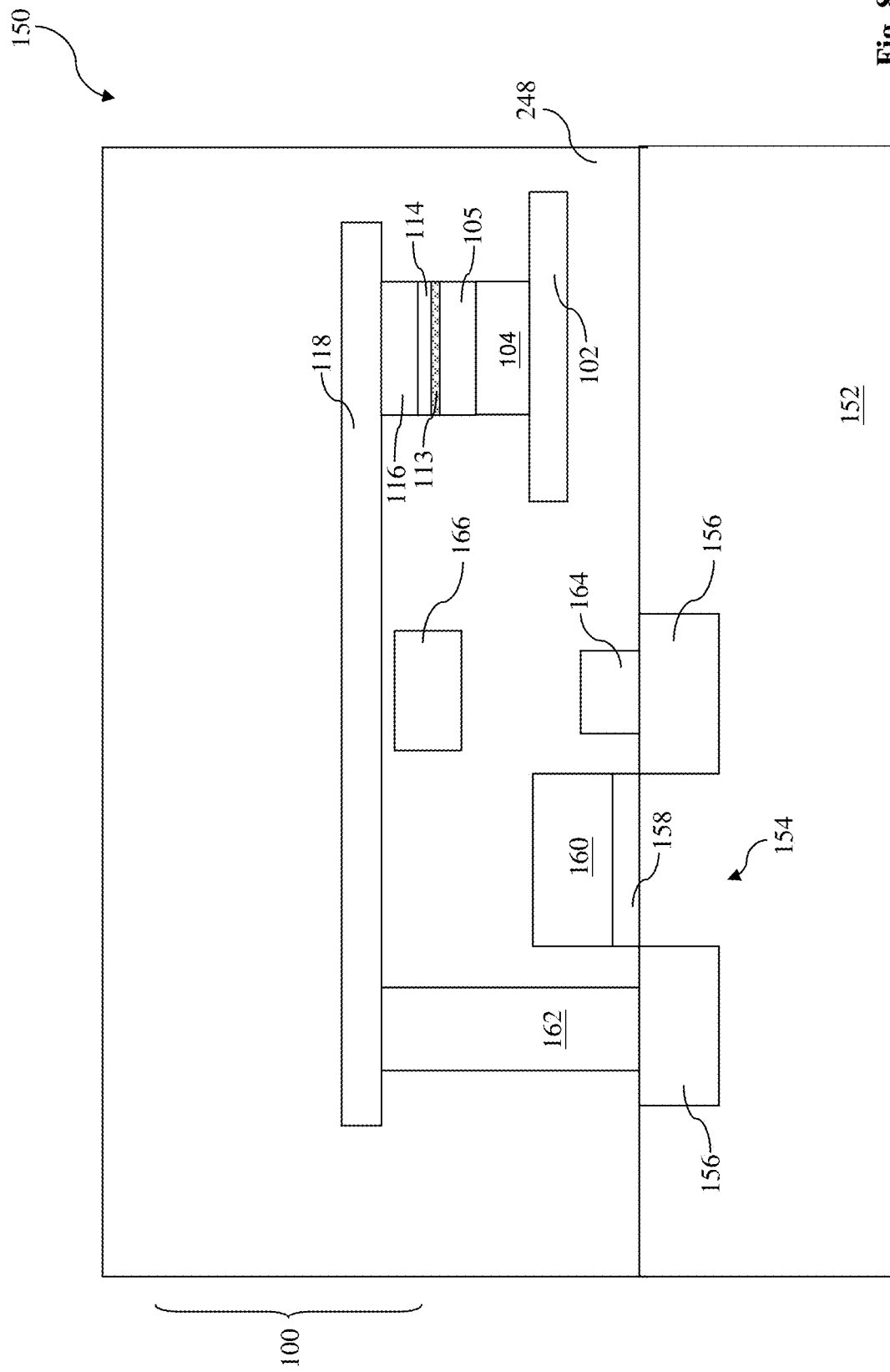
FIG. 8 is a sectional view illustrating another embodiment of a semiconductor memory device constructed according to aspects of the present disclosure.

FIG. 8 is a sectional view illustrating one embodiment of an integrated circuit constructed according to aspects of the present disclosure. The semiconductor memory device 100 of FIG. 1 is incorporated in the integrated circuit 150. The integrated circuit 150 and the method of making the same are collectively described with reference to FIG. 8. The integrated circuit 150 includes a silicon substrate 152. In other embodiments, the substrate 152 may alternatively or additionally include other semiconductor material such as germanium, gallium arsenic and diamond. The substrate 152 further includes various doped features, such as n-type wells and/or p-type wells, formed by ion implantation or diffusion. The substrate 152 also includes various isolation features, such as shallow trench isolation (STI), formed by a process known in the art, such as a process including etching to form various trenches and then deposition to fill the trench with a dielectric material using chemical vapor deposition (CVD).

The integrated circuit 150 further includes an exemplary metal-oxide-silicon (MOS) transistor 154. The MOS transistor 154 includes source and drain regions 156 formed by a process, such as ion implantation. The MOS transistor 154 further includes a gate stack interposed between the source and drain 156. The gate stack includes a gate dielectric 158 disposed on the substrate and a gate electrode 160 disposed on the gate dielectric 158. The gate dielectric 158 includes one or more dielectric films vertically interposed between the gate electrode and the substrate. In one example, the gate dielectric 158 includes a silicon oxide film formed by a thermal oxidation. In another example, the gate dielectric 158 includes a high-k film and may additionally include a thermal silicon oxide. The high-k film is a dielectric material having a dielectric constant greater than that of the silicon oxide. The high-k film, such as hafnium oxide, can be formed by a process such as atomic layer deposition (ALD), or other suitable method. The gate electrode 160 includes one or more conductive materials, such as doped polysilicon, metal, metal alloy, or combinations thereof. The gate electrode 160 may be formed by CVD, PVD or other suitable method. In another embodiment, spacers may be formed adjacent the gate electrodes.

The integrated circuit 150 also includes interconnects on the substrate. The interconnects are designed for electrical connection and routing to enable the integrated circuit to function according to its design. In one example, the interconnects are extended to and electrically connected to the exemplary MOS transistor 154. The interconnects include various conductive features formed in dielectric material 168 for proper isolation. The various conductive features include contacts, metal one (e.g., M1) lines, vias, and high level metal lines. The various conductive features may include copper, tungsten, titanium, titanium nitride, gold, aluminum, alloy, carbon nano-tubes, and/or other suitable materials, and may be formed by CVD, PVD, plating and/or other processes. The interconnects may have a homogenous or heterogeneous structure. For example, each conductive feature includes a lining layer possibly having titanium, titanium nitride, tantalum or tantalum nitride; and a bulk conductive layer having copper, tungsten, aluminum, or aluminum alloy. In another example, the conductive features are formed in a damascene process, including trench etch, deposition and chemical mechanical polishing (CMP).

In an illustrated embodiment, the interconnects include first, second and third conductive features 162, 164 and 166. Other features may be further included in the integrated circuit 150 and various processes can be implemented to form the other features. In one embodiment, the MTJ 100 and the MOS transistor 154 are configured to form a random access memory (RAM) device, also being referred to as spin-torque transfer magnetic RAM (STT-MRAM) device.

Figure 9:
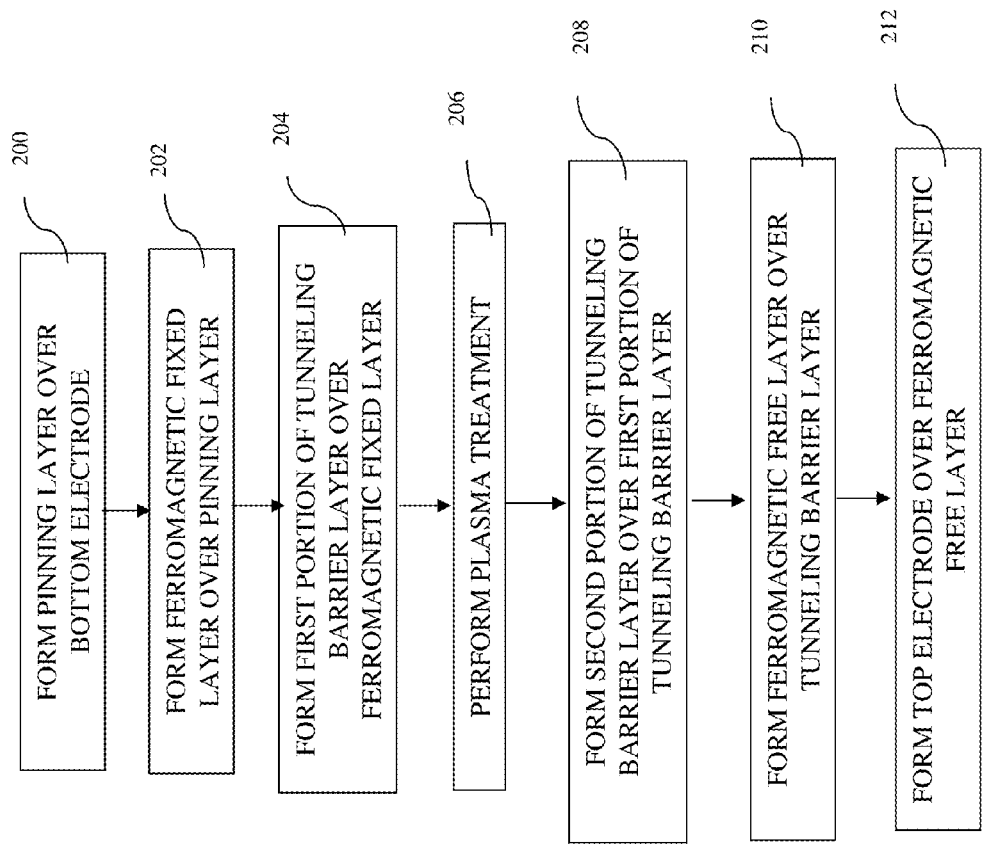
FIG. 9 is a flowchart of a method making of a semiconductor memory device constructed according to aspects of the present disclosure in another embodiment.

FIG. 9 is a flowchart illustrating a method of performing interface smoothing of an MRAM MTJ cell in accordance with one embodiment. In step 200, a pinning layer is formed over a bottom electrode. In step 202, a ferromagnetic pinned (fixed) layer is formed over the pinning layer. In step 204, a first layer of a tunneling barrier layer is formed over the ferromagnetic fixed layer. In step 206, a plasma treatment is performed on the first layer of the tunneling barrier layer. The plasma treatment performed in step 206 smoothes the surface of the first layer of the tunneling barrier layer, rendering it more uniform. In step 208, a second layer of the tunneling barrier layer is formed over the first layer. In step 210, a ferromagnetic free layer is formed over the tunneling barrier layer. In step 212, a top electrode is formed over the ferromagnetic free layer.

As described herein, a plasma treatment is applied to a layer of an MTJ cell to increase the smoothness, or decrease the roughness, thereof. For example, in one embodiment, the RMS roughness of an Mg layer having a thickness of approximately 200 Å prior to any sort of plasma treatment is approximately 5.3 Å. The RMS roughness of the Mg layer can be reduced to approximately 3.2 Å with Ar plasma treatment applied for 20 seconds. Similarly, the RMS roughness of a $Co_{60}Fe_{40}$ layer having a thickness of approximately 200 Å is approximately 3.7 Å. The RMS roughness of the same $Co_{60}Fe_{40}$ layer can be reduced to approximately 1.8 Å with Ar plasma treatment applied for 200 seconds. The RMS roughness of a $Co_{60}Fe_{20}B_{20}$ layer having a thickness of approximately 200 Å is approximately 4.4 Å. The RMS roughness of the same $Co_{60}Fe_{20}B_{20}$ layer can be reduced to approximately 3.1 Å with Ar plasma treatment applied for 200 seconds. Finally, the RMS roughness of a $Co_{20}Fe_{60}B_{20}$ layer having a thickness of approximately 200 Å is approximately 4.1 Å. The RMS roughness of the same $Co_{20}Fe_{60}B_{20}$ layer can be reduced to approximately 3.6 Å with Ar plasma treatment.

One embodiment is a method of fabricating a magnetoresistive random access memory (MRAM) cell. The method comprises forming a pinning layer over a bottom electrode; forming a ferromagnetic fixed layer over the pinning layer; and forming a first portion of a tunneling barrier layer over the ferromagnetic fixed layer. The method further comprises performing a plasma treatment on the tunneling barrier layer first portion; and subsequent to the performing, forming a second portion of the tunneling barrier layer over the first portion.

Another embodiment is a method of fabricating a magnetic tunnel junction stack for a magnetoresistive random access memory (MRAM) cell. The method comprises forming a pinning layer over a bottom electrode and forming a ferromagnetic fixed layer over the pinning layer, the ferromagnetic fixed layer comprising a plurality of films. The method further comprises forming a tunneling barrier layer over the ferromagnetic fixed layer, the tunneling barrier layer comprising at least a first film and a second film and performing a plasma treatment on one of the films prior to depositing a next film thereon.

Another embodiment is a magnetic tunnel junction (MTJ) stack for a magnetoresistive random access memory (MRAM) cell. The MTJ stack comprises a pinning layer disposed over a bottom electrode; a ferromagnetic fixed layer disposed over the pinning layer, the ferromagnetic fixed layer comprising a plurality of films; and a tunneling barrier layer disposed over the ferromagnetic fixed layer, the tunneling barrier layer comprising at least a first film and a second film. The MTJ stack further comprises a ferromagnetic free layer disposed over the second tunneling barrier layer; and a top electrode disposed over the ferromagnetic free layer. One of the films comprises a top surface that has been smoothed using a plasma treatment process performed prior to a next film being formed thereover, wherein an RMS roughness of the top surface after the plasma treatment process is at least 25% less than an RMS roughness of the top surface prior to the plasma treatment process.

It is understood that various different combinations of the above-listed embodiments and steps can be used in various sequences or in parallel, and there is no particular step that is critical or required. For example, the plasma treatment step 206 illustrated in FIG. 9 may be performed immediately subsequent/prior to steps other than steps 204/208. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

Another embodiment is a semiconductor memory device. The semiconductor memory device includes a pinning layer having an anti-ferromagnetic material and disposed over a first electrode; a pinned layer disposed over the pinning layer; a composite layer disposed over the pinned layer, the composite layer having a magnetic material randomly distributed in a non-magnetic material; a barrier layer disposed on the composite layer; a free layer disposed over the barrier layer; and a second electrode disposed over the free layer.

In one example of the semiconductor memory device, the magnetic material of the composite layer includes a ferromagnetic material. In another example, the magnetic material of the composite layer includes cobalt and iron; and the non-magnetic material of the composite layer includes one of magnesium and aluminum. In yet another example, the barrier layer includes one of magnesium and aluminum. In another example, the pinned layer includes a ferromagnetic layer containing cobalt and iron. In yet another example, the pinned layer includes a first ferromagnetic layer; a spacer layer disposed on the first ferromagnetic layer; and a second ferromagnetic layer disposed on the spacer layer.

In another example, the spacer layer includes a material selected from the group consisting of ruthenium (Ru), titanium (Ti), tantalum (Ta), copper (Cu), and silver (Ag). In yet another example, each of the first and second ferromagnetic layers includes a cobalt-iron-boron (CoFeB) film; and a cobalt-iron (CoFe) film on the CoFeB film. In another example, the first and second electrodes each include tantalum (Ta); the barrier layer includes magnesium oxide (MgO); and the anti-ferromagnetic of the pinning layer includes platinum manganese (PtMn).

Another embodiment is a semiconductor memory device. The device includes an anti-ferromagnetic layer disposed over a semiconductor substrate; a pinned layer having a multiple of films disposed over the anti-ferromagnetic layer; a composite layer disposed over the pinned layer, the composite layer having a magnetic material randomly dispersed in a non-magnetic material; a barrier layer disposed on the composite layer; and a free layer disposed over the barrier layer.

In one embodiment of the semiconductor memory device, the magnetic material of the composite layer includes cobalt and iron; and the non-magnetic material of the composite layer includes magnesium. In another example, the non-magnetic material of the composite layer includes magnesium and magnesium oxide. In yet another example, the pinned layer includes a first ferromagnetic layer; a spacer layer disposed on the first ferromagnetic layer; and a second ferromagnetic layer disposed on the first ferromagnetic layer. In yet another example, the spacer layer includes a material selected from the group consisting of ruthenium (Ru), titanium (Ti), tantalum (Ta), copper (Cu), and silver (Ag). In yet another example, each of the first and second ferromagnetic layers includes a cobalt-iron-boron (CoFeB) film; and a cobalt-iron (CoFe) film.

Another embodiment is a method of fabricating a magnetoresistive random access memory (MRAM) cell. The method includes forming a pinning layer over a bottom electrode; forming a pinned layer over the pinning layer; forming a pre-barrier layer over the pinned layer; performing a plasma treatment to the pre-barrier layer; forming a barrier layer over the pre-barrier layer; and forming a free layer over the barrier layer.

In one example of the method, the forming a pre-barrier layer includes performing a deposition in a physical vapor deposition (PVD) tool; and the performing a plasma treatment to the pre-barrier layer includes performing the plasma treatment to the pre-barrier layer by the PVD tool. In another example, the performing a plasma treatment to the pre-barrier layer includes performing a sputtering etch to the pre-barrier layer by a PVD tool. In yet another example, the performing a sputtering etch to the pre-barrier layer includes using a plasma source from one of argon (Ar), nitrogen ($N_2$), ammonia ($NH_3$), helium (He), oxygen ($O_2$), krypton (Kr), and hydrogen ($H_2$). In yet another example, the performing a sputtering etch includes implementing a gas flow ranging between about 50 sccm and about 300 sccm and applying an alternating current (ac) power ranging between about 20 V and about 200 V. In yet another example, the performing a sputtering etch includes applying a direct current (dc) power ranging between about 50 V and about 200 V and an etch duration ranging between about 20 second and about 200 second.

In another example of the method, the forming a pre-barrier layer includes forming a magnesium (Mg) layer in the PVD tool. In yet another example, the forming a pre-barrier layer further includes applying an oxidation process to the Mg layer in the PVD tool, resulting in a magnesium oxide (MgO) layer; and forming another Mg layer over the MgO layer in the PVD tool. In yet another example, the forming a barrier layer includes forming a first Mg layer in the PVD tool; applying an oxidation process to the first Mg layer in the PVD tool, resulting in a MgO layer; and forming a second Mg layer over the MgO layer in the PVD tool. In yet another example, the method further includes performing another plasma treatment to the pinned layer in a PVD tool, and the forming the pinned layer includes depositing the pinned layer in the PVD tool.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor memory device, comprising:
    a pinning layer having an anti-ferromagnetic material and disposed over a first electrode;
    a pinned layer disposed over the pinning layer;
    a composite layer disposed over the pinned layer, wherein a portion of the pinned layer is embedded within the composite layer such that the composite layer has a magnetic material randomly distributed in a non-magnetic material;
    a barrier layer disposed on the composite layer;
    a free layer disposed over the barrier layer; and
    a second electrode disposed over the free layer.

2. The device of claim 1, wherein the magnetic material of the composite layer includes a ferromagnetic material.

3. The device of claim 2, wherein:
    the magnetic material of the composite layer includes cobalt and iron; and
    the non-magnetic material of the composite layer includes one of magnesium and aluminum.

4. The device of claim 2, wherein the barrier layer includes one of magnesium and aluminum.

5. The device of claim 2, wherein the pinned layer includes a ferromagnetic layer containing cobalt and iron.

6. The device of claim 1, wherein the pinned layer includes:
    a first ferromagnetic layer;
    a spacer layer disposed on the first ferromagnetic layer; and
    a second ferromagnetic layer disposed on the spacer layer.

7. The device of claim 6, wherein the spacer layer includes a material selected from the group consisting of ruthenium (Ru), titanium (Ti), tantalum (Ta), copper (Cu), and silver (Ag).

8. The device of claim 6, wherein each of the first and second ferromagnetic layers includes:
    a cobalt-iron-boron (CoFeB) film; and
    a cobalt-iron (CoFe) film on the CoFeB film.

9. The device of claim 1, wherein:
    the first and second electrodes each include tantalum (Ta);

the barrier layer includes magnesium oxide (MgO); and the anti-ferromagnetic material of the pinning layer includes platinum manganese (PtMn).

10. A semiconductor memory device, comprising:

an anti-ferromagnetic layer disposed over a semiconductor substrate;

a pinned layer having a multiple of films disposed over the anti-ferromagnetic layer;

a composite layer disposed over the pinned layer, the composite layer having a magnetic material randomly dispersed in a non-magnetic material;

a barrier layer disposed on the composite layer, wherein a portion of the barrier layer physically contacts a portion of the pinned layer; and a free layer disposed over the barrier layer.

11. The device of claim 10, wherein:

the magnetic material of the composite layer includes cobalt and iron; and the non-magnetic material of the composite layer includes magnesium.

12. The device of claim 10, wherein the non-magnetic material of the composite layer includes magnesium and magnesium oxide.

13. The device of claim 10, wherein the pinned layer includes:

a first ferromagnetic layer;

a spacer layer disposed on the first ferromagnetic layer; and a second ferromagnetic layer disposed on the first ferromagnetic layer.

14. The device of claim 13, wherein the spacer layer includes a material selected from the group consisting of ruthenium (Ru), titanium (Ti), tantalum (Ta), copper (Cu), and silver (Ag).

15. The device of claim 13, wherein each of the first and second ferromagnetic layers includes:

a cobalt-iron-boron (CoFeB) film; and a cobalt-iron (CoFe) film.

16. The device of claim 10, wherein the portion of the pinned layer includes the magnetic material.

17. A device comprising:

a pinning layer having an anti-ferromagnetic material and disposed over a semiconductor substrate;

a pinned layer disposed over the pinning layer;

a composite layer disposed over the pinned layer, wherein a portion of the pinned layer is embedded within the composite layer such that the composite layer has a magnetic material randomly distributed in a non-magnetic material;

a barrier layer disposed on the composite layer; and a free layer disposed over the barrier layer.

18. The device of claim 16, further comprising an electrode physically contacting the free layer.

19. The device of claim 16, wherein a portion of the barrier layer physically contacts the portion of the pinned layer.

20. The device of claim 16, wherein the composite layer has a top surface facing the barrier layer, wherein the top surface is formed of the portion of the pinned layer.

21. The device of claim 16, wherein the pinned layer includes:

a first ferromagnetic layer;

a spacer layer disposed on the first ferromagnetic layer; and a second ferromagnetic layer disposed on the spacer layer.

22. The device of claim 21, wherein the second ferromagnetic layer is embedded within the composite layer.

23. The device of claim 16, wherein the magnetic material of the composite layer includes a ferromagnetic material.

24. The device of claim 16, wherein the magnetic material of the composite layer includes cobalt and iron, and wherein the non-magnetic material of the composite layer includes one of magnesium and aluminum.

25. The device of claim 16, wherein the barrier layer includes one of magnesium and aluminum.

* * * * *